United States Patent
Gunji et al.

(10) Patent No.: US 6,486,472 B2
(45) Date of Patent: Nov. 26, 2002

(54) INSPECTING SYSTEM USING ELECTRON BEAM AND INSPECTING METHOD USING SAME

(75) Inventors: Yasuhiro Gunji, Hitachioota; Taku Ninomiya, Hitachinaka; Masatsugu Kametani; Masahiro Koyama, both of Tsuchiura; Kenjiro Yamamoto, Matsudo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,394

(22) Filed: Aug. 30, 2001

(65) Prior Publication Data

US 2002/0117619 A1 Aug. 29, 2002

(30) Foreign Application Priority Data

Feb. 26, 2001 (JP) ........................................ 2001-050485

(51) Int. Cl.[7] .............................................. H01J 37/256
(52) U.S. Cl. ........................ 250/310; 250/307; 324/750
(58) Field of Search ................... 250/307, 310; 324/750

(56) References Cited

U.S. PATENT DOCUMENTS 6,300,629 B1 * 10/2001 Lawrence .................... 250/310

FOREIGN PATENT DOCUMENTS

| JP | 04-282543 | 10/1992 |
|----|-----------|---------|
| JP | 10-012170 | 1/1998 |
| JP | 2000-067791 | 3/2000 |
| JP | 2000-100362 | 4/2000 |

* cited by examiner

Primary Examiner—Bruce Anderson
Assistant Examiner—Zia R. Hashmi
(74) Attorney, Agent, or Firm—Kenyon & Kenyon

(57) ABSTRACT

The present invention aims to prevent degradation in performance due to a change in image quality and deflection distortions or the like in the vicinity of both ends of a scan area and detect a defect in a sample such as a semiconductor wafer or the like with high accuracy when the defect is inspected by use of an electron beam image, and allow a monitor to confirm an image area to be checked. The present invention is provided with means for comparing and checking defects in the sample, based on an image signal in which the neighborhoods of both ends of horizontal and vertical scan areas are respectively deleted under control of a blanking signal and a vertical synchronizing signal.

10 Claims, 5 Drawing Sheets

INSPECTING SYSTEM USING ELECTRON BEAM AND INSPECTING METHOD USING SAME

BACKGROUND OF THE INVENTION

1. Field of the Invention

The present invention relates to an inspecting system and an inspecting method both using an electron beam, both of which inspect a semiconductor device having microfabricated patterns, a substrate, a photomask (exposure mask), a liquid crystal, etc.

2. Description of the Related Art

In order to detect the occurrence of abnormalities and defects in a manufacturing process of a semiconductor device in early stages or in advance, the inspection of patterns on a semiconductor wafer is carried out upon completion of respective manufacturing process steps.

As a method of inspecting such defects, a method and a system for inspecting each of patterns through the use of an electron beam image high in resolution have been put into practical use.

There is a need to acquire or obtain a high SN image at a very high speed with a view toward performing high throughput and high-accurate inspections with an increase in bore diameter of a wafer and a scale-down of each circuit pattern. Therefore, the number of electrons applied through the use of a large current beam of 1000 times or more (of 10 nA or more) one for a normal scanning electron microscope (SEM) is ensured and a high SN ratio is maintained. It is also essential that secondary electrons generated from a substrate and reflected electrons are detected at high speed and with high efficiency. A low accelerating electron beam of 2 KeV or less is applied so that a semiconductor substrate with an insulating film such as a resist or the like is not placed under the influence of charging.

JP-A No. H10 (1998)-12170 discloses a technology wherein in a scan type charged particle beam device capable of varying a scanning speed, a digital circuit matches the timing for blanking-signal OFF with the timing provided to start the capturing of image data in order to prevent a distortion of an image caused by a distortion of a scan signal at an image take-in or capturing start time at the time that a scanning speed is fast.

JP-A No. 2000-100362 describes a system for digitally controlling various timings at a fast beam scan.

A SEM type inspecting system has the possibility that since a desired image acquisition area is irradiated with a beam by one pixel from its end to form an image signal, the neighborhoods of both ends in the area will differ from its central portion in conditions such as the amount of abeam current, thereby varying the quality of an image. From the necessity that the center of the beam is placed in the center of the area, large deflection distortions occur in both ends of the image acquisition area. This is not undesirable as an electron optical condition. When comparison checking is made using an image placed under such an adverse condition, the performance of inspection might be degraded.

Even if the prior art is applied to the inspection SEM, the degradation in inspection performance at both ends of the image acquisition area cannot be prevented from occurring.

A problem arises in that a screen condition related to a detection area placed under inspection cannot be confirmed through a monitor.

SUMMARY OF THE INVENTION

An object of the present invention is to provide an inspecting system or method using an electron beam, capable of confirming a screen condition related to a detection area placed under inspection by means of a monitored image.

Another object of the present invention is to provide an inspecting system or method using an electron beam, capable of preventing degradation in inspection performance due to a change in image quality and deflection distortions at ends of an inspected image, a shading phenomenon, etc.

According to one aspect of the present invention, when a defect in a sample is detected based on a detected signal of secondary charged particles, for example secondary electrons, generated by causing an electron beam to scan, such a defect is detected based on an image signal in which both ends of a scan area are deleted.

According to another aspect of the present invention, areas each having a predetermined width at its scan start end and scan completion end, and image areas lying therein are distinctively displayed on a monitor.

According to a further aspect of the present invention, blanking or a synchronizing signal for taking in or capturing an image is controlled to exclude both ends lying in a scan area from a defect inspection area.

According to one preferred embodiment of the present invention, electron beam scanning means executes a high-speed or fast scan on a sample in a first direction and a low-speed or slow scan on the sample in a second direction different from the first direction in the form of their compresence. Areas at both ends in a scan area, which are not used in image comparing means, are set by blanking as viewed in a fast scan direction, whereas they are set according to activation and inactivation of a synchronizing signal as viewed in a low-speed or slow scan direction.

Owing to these, an inspecting system using an electron beam can confirm high-accuracy timing matching in units of 10 ns on a monitored image. An inspecting system or method using an electron beam can be provided which prevents degradation in the accuracy of inspection with instability of a swing start and a swing end at both ends of a scan area as viewed in a high-speed direction or a low-speed direction and has higher-accuracy inspection performance.

Other objects and features of the present invention will be demonstrated by the description of the following embodiments.

DETAILED DESCRIPTION OF THE PREFERRED EMBODIMENTS

Preferred embodiments of the present invention will hereinafter be described with reference to the accompanying drawings.

(First Embodiment)

Figure 1:
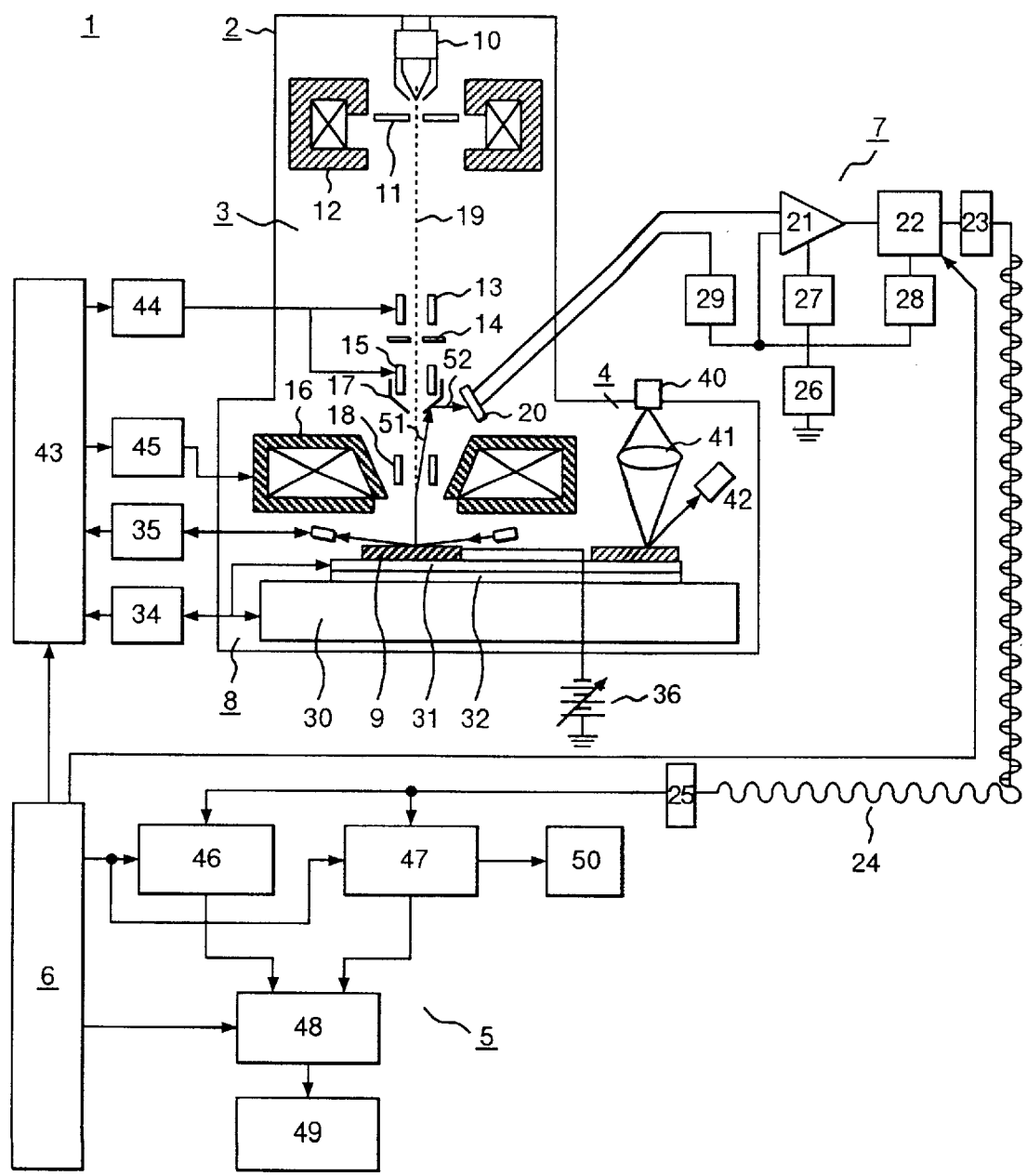
FIG. 1 is a vertical sectional view and a system overall block diagram both showing a system configuration of a SEM type visual external inspecting system.
Figure 2:
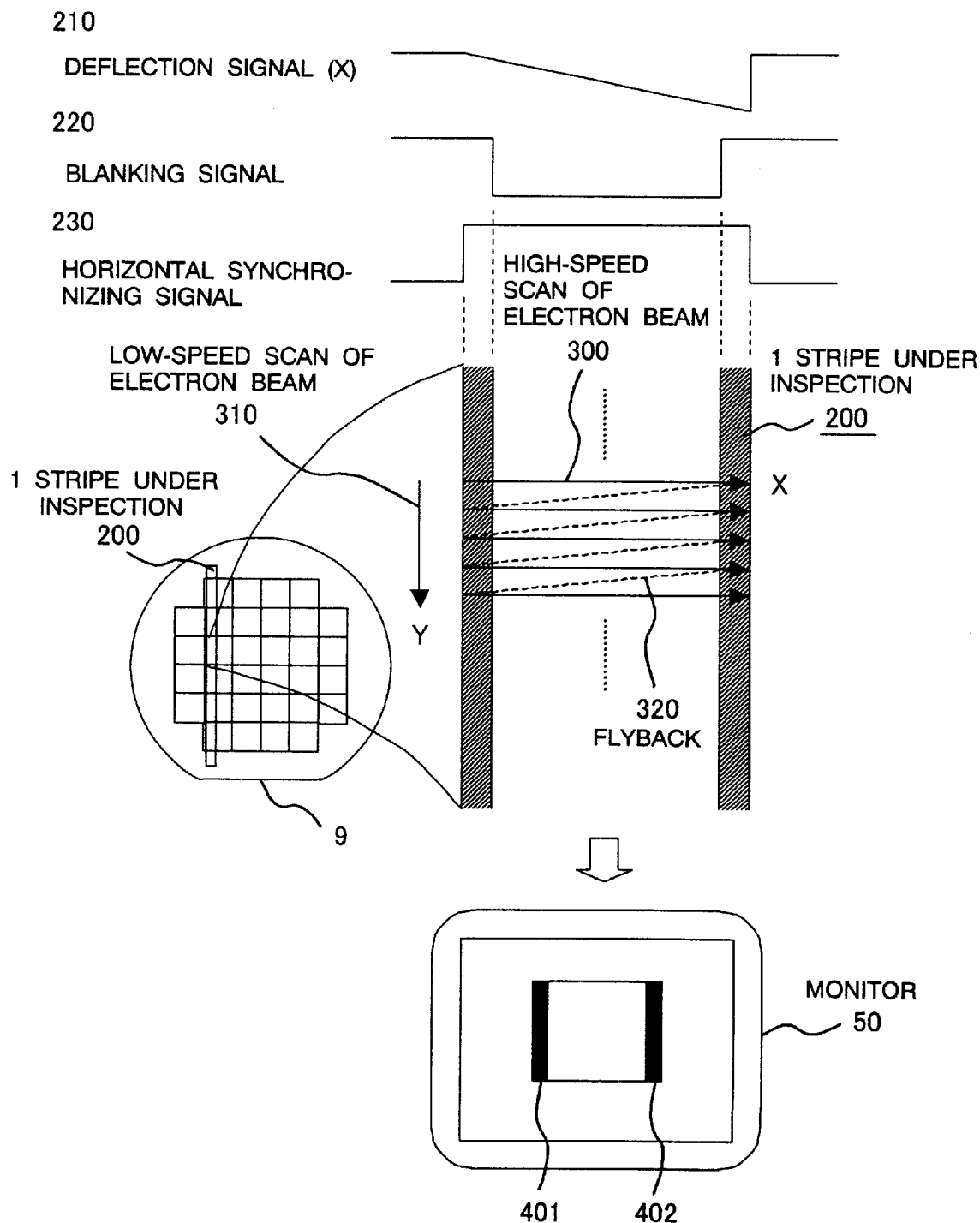
FIG. 2 is a waveform diagram showing sequence timings used in a fast scan according to a first embodiment of the present invention and is a plan view of a semiconductor wafer.

FIGS. 1 and 2 show a first embodiment of the present invention.

FIG. 1 is a vertical sectional view and a control block diagram both showing an overall configuration of a SEM type visual external inspecting system illustrating an inspecting apparatus or system using an electron beam, according to the first embodiment of the present invention. The SEM type visual external inspecting system 1 comprises an inspecting room or chamber 2 evacuated therein, a spare room or chamber (not shown in the present embodiment) for conveying a sample substrate 9 to within the inspecting chamber 2, an image processing unit 5, a controller 6, and a secondary electrons detecting unit 7.

The inspecting chamber 2 is roughly made up of an electronic optical system 3, a sample chamber 8, and an optical microscope unit 4. The electronic optical system 3 comprises an electron gun 10, an electron-beam drawing or pullout electrode 11, a condenser lens 12, a blanking deflector 13, a scan deflector 15, a diaphragm 14, an objective lens (lens means) 16, a reflecting plate 17, and an E×B deflector 18. The E×B deflector 18 deflects electrons in such a manner that the amount of deflection of a primary electron beam by an electric field and the amount of deflection of a primary electron beam by a magnetic field cancel each other out and the two overlap each other with respect to secondary electrons. Of the secondary electrons detecting unit 7 to be described later, a secondary electrons detector 20 is disposed above the objective lens 16 lying within the inspecting chamber 2.

The sample chamber 8 comprises a sample table 30, an X stage 31, a Y stage 32, a position monitoring length-measuring device 34, and a sample height measuring device 35. The optical microscope unit 4 is located in the vicinity of the electronic optical system 3 lying within the inspecting chamber 2 and is installed at a position where they are distant from each other by such an extent that no influence is exerted on each other. Further, the X stage 31 or the Y stage 32 moves forward and backward alternately between the electronic optical system 3 and the optical microscope unit 4. The optical microscope unit 4 comprises a light source 40, an optical lens 41, and a CCD (Charge Coupled Device) camera 42.

The image processing unit 5 comprises a first image storage part 46, a second image storage part 47, an operation part 48 and a defect determination part 49. A captured electron-beam image or optical image is displayed on a monitor 50.

Operation instructions and operating conditions used for the respective parts of the system are inputted to and outputted from the controller 6. Conditions such as an accelerating voltage, a deflected width of an electron beam at the occurrence of the electron beam, timings provided to capture signals by the secondary electrons inspecting unit 7, a sample table traveling speed, etc. have been arbitrarily or selectively set and inputted to the controller 6 in advance. The controller 6 causes a correction control circuit 43 to monitor shifts or displacements in position and height from signals outputted from the position monitoring length-measuring device 34 and the sample height measuring device 35. Further, the controller 6 causes the correction control circuit 43 to generate correction signals, based on the result thereof and allows it to send the correction signal to an objective lens source 45 and a scan signal generator 44 so that an electron beam is always applied to a proper position.

In order to obtain an image on a sample 9, a thinly-focused electron beam 19 is applied to the sample 9 to thereby produce secondary electrons 51. They are detected in synchronism with the scanning of the electron beam 19 and the movements of the X stage 31 and the Y stage 32.

The speeding up of an inspection velocity or speed is essential for the SEM type visual external inspecting system. Thus, the SEM type visual external inspecting system does not perform the scanning of an electron beam of an electron-beam current on the order of pA at low speed, scans made over a large number of times, and the superimposition of respective images on one another as in the case of the normal SEM. Even for the purpose of restricting charging on an insulating material, the scanning of the electron beam is made once or about several times at high speed and the scanning is not made many times. Thus, in the present embodiment, an electron beam represented in the form of, for example, a large current of 100 nA corresponding to about 1000 times or more as compared with the conventional SEM is scanned once alone to thereby form an image.

A diffusion refill-type thermofield emission electron source is used for electron gun 10. Using the electron gun 10 makes it possible to ensure an electron beam current stable as compared with, for example, a tungsten filament electron source and a cold field emission type electron source. Therefore, an electron beam image whose change in brightness is low, can be obtained. Since the electron beam current can be set high by use of the electron gun 10, a high-speed inspection to be described later can be realized. A voltage is applied between the electron gun 10 and the drawing electrode 11 so that the electron beam 19 is pulled out or derived from the electron gun 10.

The electron beam 19 is accelerated by the application of a negative potential corresponding to a high voltage to the electron gun 10. Thus, the electron beam 19 is moved to the sample table 30 by means of energy equivalent to the negative potential, followed by convergence on the condenser lens 12. Further, the electron beam 19 is thinly focused by the objective lens 16, followed by application to the sample 9 mounted on the X stage 31 and the Y stage 32 placed on the sample table 30. The sample 9 is a semiconductor wafer, a chip or a substrate having a micro-fabricated circuit pattern such as a liquid crystal, a mask or the like. The scan signal generator 44 for generating a scan signal and a blanking signal is connected to the blanking deflector 13, and the objective lens source 45 is connected to the objective lens 16.

A high-voltage power supply 36 applies a negative voltage to the sample 9. Owing to an adjustment to the voltage produced from the high-voltage power supply 36, the electron beam 19 is decelerated and electron-beam irradiation energy applied to the sample 9 can be adjusted to the optimum value without changing the potential of the electron gun 10.

The secondary electrons 51 generated by applying the electron beam 19 onto the sample 9 are accelerated under the negative voltage applied to the sample 9. The E×B deflector 18 for turning the orbit of secondary electrons by means of both electric and magnetic fields without exerting an influence on the orbit of the electron beam 19 is disposed above the sample 9. The secondary electrons 51 accelerated by the E×B deflector 18 are deflected in a predetermined direction. The intensities of the electric and magnetic fields applied to the E×B deflector 18 allows adjustments to the amount of deflection of secondary electrons by the electric and magnetic fields. Further, the electric and magnetic fields can be varied in cooperation with the negative voltage applied to the sample 9.

The secondary electrons 51 deflected by the E×B deflector 18 collide with the reflecting plate 17 under predetermined conditions. The reflecting plate 17 is shaped in the form of a cone and also has a shield pipe function for shielding the electron beam 19 applied to the sample 9. When the accelerated secondary electrons 51 collides with the reflecting plate 17, second secondary electrons 52 having an energy which ranges from a few eV to 50 eV, is produced from the reflecting plate 17.

While a description has been made above, of the case in which the secondary electrons detector 20 is placed within the evacuated inspecting chamber 2 as one for the secondary electrons detecting unit 7, a preamplifier 21, an AD converter 22, an optical converting means 23, an optical transmitting means 24, an electric converting means 25, a preamplifier drive source 27, an AD converter drive source 28, and a reverse bias source 29 are provided outside the inspecting chamber 2. The secondary electrons detecting unit 7 is rendered floating at a positive potential by the high-voltage power supply 26. The second secondary electrons 52 generated from the collision of the secondary electrons 51 with the reflecting plate 17 are introduced into the secondary electrons detector 20 under the action of a pull-in or suction electric field created by the positive potential.

The secondary electrons detector 20 detects the second secondary electrons 52 in association or synchronization with timing provided to scan the electron beam 19. The secondary electrons detector 20 takes in or captures the secondary electrons in synchronism with horizontal and vertical synchronizing signals respectively produced by horizontal and vertical synchronizing signal generating units (means) lying within the controller 6, for example. A signal outputted from the secondary electrons detector 20 is amplified by the preamplifier 21, which in turn is converted into digital data by the AD converter 22, followed by transmission to the image processing unit 5. Since the detected analogy signal is digitized and transmitted immediately after its detection, a signal fast in speed and high in S/N ratio can be obtained.

The sample 9 has been placed on the X stage 31 and the Y stage 32. Either one of a method for stopping the X stage 31 and the Y stage 32 upon the execution of an inspection to thereby cause the electron beam 19 to two-dimensionally scan, and a method for sequentially moving the X stage 31 and the Y stage 32 in a Y direction at a constant speed upon the execution of the inspection to thereby cause the electron beam 19 to linearly scan in an X direction can be selected. The method of inspecting the former sample 9 at rest is effective when a given specific relatively small area is inspected, whereas when a relatively wide area is inspected, the method of consecutively moving the sample 9 at the constant speed and inspecting it is effective. Blanking control on the electron beam 19 is executed in such a manner that the electron beam 19 is deflected by the blanking deflector 13 and does not pass through the diaphragm 14.

A laser interference-based wavemeter was used as the position monitoring length-measuring device 34 for monitoring the positions of the X stage 31 and the Y stage 34 in the present embodiment. The positions of the X stage 31 and the Y stage 32 can be monitored in real time, and the result of monitoring is to be transferred to the controller 6. Further, data about the numbers of revolutions of motors used for the X stage 31, Y stage 32 and rotating stage 33 are also transferred from their drivers to the controller 6 in the same manner. The controller 6 is capable of accurately grasping each irradiated area and position of the electron beam 19, based on these data. Accordingly, the correction control circuit 43 is capable of correcting a displacement of the irradiated position of the electron beam 19 in real time as necessary. Further, areas irradiated with the electron beam 19 can be stored every samples 9.

The sample height measuring device 35 makes use of an optical measuring instrument, e.g., a laser interference measuring instrument or a reflected-light type measuring instrument for measuring a change at a position of a reflected light. The sample height measuring device 35 is configured so as to be capable of measuring the height of the sample 9 placed on the X stage 31 and the Y stage 32 in real time. The present embodiment uses a method for applying a slender white light transmitted through a slit to the sample 9 through a transparent window, detecting the position of its reflected light by use of a position detecting monitor, and calculating the amount of change in height of the sample 9 from a variation in position. The focal distance of the objective lens 16 is dynamically corrected based on data measured by the optical height measuring device 35, whereby the focused electron beam 19 can be always applied to each area to be inspected. Further, the warpage of the sample 9 and a height distortion thereof are measured in advance before the application of the electron beam to the sample 9. In this state, the objective lens 16 may also be configured so that correction conditions thereof are set every inspected areas, based on their data.

The image processing unit 5 comprises the first image storage part 46, the second image storage part 47, the operation part 48, the defect determination part 49 and the monitor 50. An image signal on the sample 9, which is detected by the secondary electrons detector 20, is brought into digital form by the AD converter 22, after which it is converted into a light signal by the light or optical converting means 23, which in turn is transmitted by the optical transmitting means 24. The electric converting means 25 converts it into an electric signal again, which in turn is stored in the first image storage part 46 or the second image storage part 47. The operation part 48 performs an alignment between the image signal stored in the first image storage part 46 and the image signal stored in the second image storage part 47, standardization of a signal level, and various image processes for removing noise signals and computes both the image signals for comparison. The defect determination part 49 compares the absolute value of the differential image signal computed for comparison by the operation part 48 with a predetermined threshold value. When the level of the differential image signal is larger than the predetermined threshold value, the defect determination part 49 judges their pixels as defect candidates, and their positions, the number of defects, etc. are displayed on the monitor 50.

FIG. 2 shows a timing sequence of various signals for forming an image signal. Namely, FIG. 2 illustrates timings for three types of signals: a horizontal (X-axis direction) deflection signal 21 for driving the scan deflector 15 shown in FIG. 1, a blanking signal 220 for driving the blanking deflector 13, and a horizontal synchronizing signal 230 for determining timing provided to operate the AD converter 22. As described above, the deflection signal (X) 210 and the blanking signal 220 are generated by the scan signal generator 44 and determine to which part of the sample 9 the electron beam should be applied in practice. The horizontal synchronizing signal 230 determines which part of detected signal should be taken out as an image signal in the form in which it is synchronized with the deflection signal (X) 210.

FIG. 2 showing the first embodiment illustrates, in sequence timings for transverse high-speed or fast scans (300), a situation in which an electron beam is sent in a Y-axis direction corresponding to a vertical direction at a low-speed or slow scan (310) while the electron beam is being scanned over the sample 9 at high speed in an X-axis direction corresponding to a horizontal direction of FIG. 2 (300), whereby a 1 stripe 20 shown in the drawing is inspected. Incidentally, the slow scan (310) in the Y-axis direction may compensate for an electron beam scan according to a stage movement in addition to deflection. Alternatively, the electron beam scan can also be performed according to the stage movement alone in place of the deflection.

In the present embodiment, the width of a halt or inactivation (electron-beam irradiated state) of the blanking signal 220 is set narrower than an X-axis deflection area (sawtooth wave portion of deflection signal) and an ON width of the horizontal synchronizing signal to thereby delete or remove signals at left and right ends of an image. Namely, the blanking signal 220 is inactivated after the start-up of the horizontal synchronizing signal 230 at a start end (left end) of an X-axis scan area, whereas at an end (right end) of the X-axis scan area, the horizontal synchronizing signal 230 is brought to a halt or inactivated after the startup of the blanking signal 220. Thus, electron-optically unstable portions of a swing start (left end) and a swing end (right end) of the electron beam 19 can be removed from an image signal, thereby making it possible to prevent degradation in inspection performance.

Since the portions are already kept in a blanking ON state when the electron beam 19 is retraced from the right end, it is possible to prevent even degradation in inspection performance due to a shading phenomenon or the like without applying extra electron beams indicated by broken lines 320 onto the sample. Further, even as viewed from the standpoint of sample protection, a large advantageous effect is brought about in that the application of the extra electron beams is cut.

According to the present embodiment, since the deleted portions at both ends are respectively kept in the blanking ON, the image signal results in a black signal indicative of a signal-free state, and black vertical zones 401 and 402 occur in both ends of an image on the monitor 50. Therefore, a large advantageous effect is obtained in that it is possible to visually confirm that the state of scanning on the sample 9 is placed under the above-described favorable condition.

Namely, the monitor 50 is provided with means for distinctively displaying, within a scan area (sawtooth wave portion of X-axis deflection signal 210) of each of the scan means 44 and 15, areas 401 and 402 each having a predetermined width at its scan start end and scan completion end, and image areas lying therein. In other words, the monitor 50 has means for substituting the areas 401 and 402 each having the predetermined width with the predetermined image signal such as the black signal indicative of the signal-free state and displaying it. It can be said that the monitor 50 is provided with a display unit for displaying the relationship between the blanking signal 220 and the horizontal synchronizing signal 230 on the screen thereof by the areas 401 and 402 each having the predetermined width. Further, it can be said that the monitor 50 is provided with a display unit for displaying a deflection area (sawtooth wave portion of X-axis deflection signal 210) and image areas lying within the deflection area on the screen thereof.

(Second Embodiment)

Figure 3:
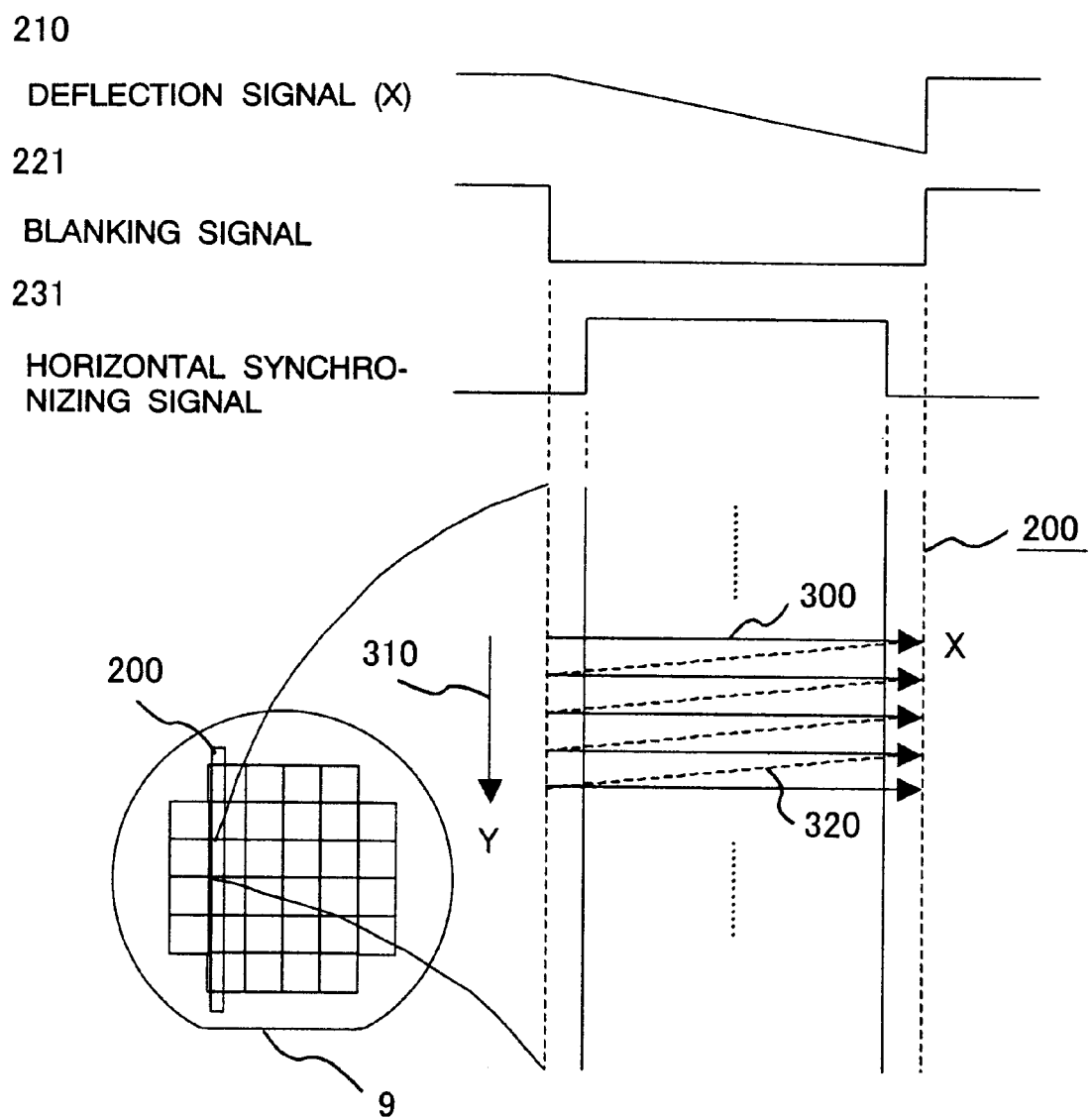
FIG. 3 is a waveform diagram illustrating sequence timings used in a fast scan according to a second embodiment of the present invention.

A second embodiment of the present invention is shown in FIG. 3. FIG. 3 is a diagram similar to FIG. 2 and shows timings provided to scan over a sample 9 at high speed in a transverse (X-axis) direction shown in the drawing. The second embodiment is different from the first embodiment in that the above timings are simply replaced with those for a blanking signal 221 and a horizontal synchronizing signal 231. Namely, the horizontal synchronizing signal 231 is set narrower than a deflection width and a blanking-OFF width, whereby portions at both ends of an electron-beam X-axis scan area are removed or deleted from an image signal. In other words, when a desired image acquisition area is set as the width of the horizontal synchronizing signal, this is equivalent to the fact that the electron-beam scan area is taken extra greater. Namely, at a start end (left end in the drawing) of the X-axis scan area, the horizontal synchronizing signal 231 is enabled or activated after the stop or inactivation of the blanking signal 221, whereas at an end (right end) of the X-axis scan area, the blanking signal 221 is started up or activated after the horizontal synchronizing signal 231 is brought to a halt or inactivated. Thus, electron-optically unstable portions of a swing start (left end) and a swing end (right end) of an electron beam 19 can be removed from the image signal, thereby making it possible to prevent degradation in inspection performance.

(Third Embodiment)

Figure 4:
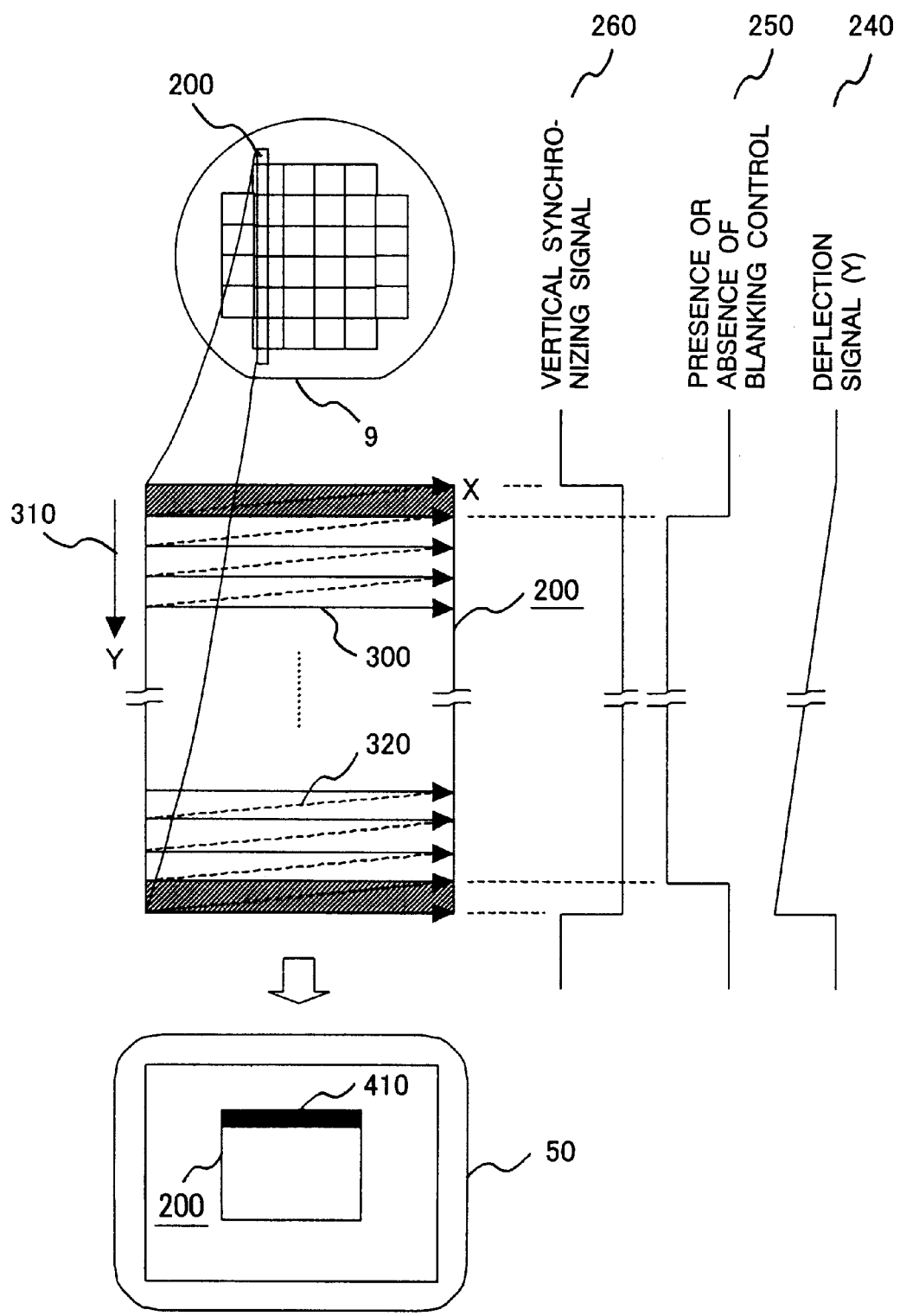
FIG. 4 is a waveform diagram depicting sequence timings used in a slow scan according to a third embodiment of the present invention and is a plan view of a semiconductor wafer.

A third embodiment of the present invention is shown in FIG. 4. FIG. 4 shows a case in which an electron beam is sent in a vertical (Y-axis) direction under a slow scan (310) while the electron beam is being scanned over a sample 9 at high speed in a transverse (X-axis) direction in the drawing to thereby attempt the inspection of a 1 stripe 200 in the drawing, and illustrates sequence timings for the slow scan in the Y-axis direction thereof. Incidentally, the slow scan in the Y-axis direction may compensate for an electron beam scan according to a stage movement herein.

In this case, signals corresponding to upper and lower ends of an image are deleted according to a method including a step for setting the width of OFF (electron-beam irradiated state) of a signal 250 indicative of the presence or absence of blanking control so as to be narrower than a Y-axis deflection width (sawtooth wave portion of Y-axis deflection signal 240) and the width of ON of a vertical synchronizing signal 260, and stopping the blanking control at a start end of an electron beam scan area (OFF of 250) after the startup of the vertical synchronizing signal 260, and a step for deactivating the vertical synchronizing signal at an end of the electron beam scan area after the start of the blanking control (ON of 250). Thus, electron-optically unstable portions of a swing start (upper end) and a swing end (lower end) of an electron beam can be removed from an image signal, thereby making it possible to prevent degradation in inspection performance. In other words, there is provided means for setting end areas unused in the aforementioned image comparing means. Since the deleted upper and lower end portions are placed under blanking ON, it is possible to form a black horizontal or transverse zone 410 on the image of a monitor 50 and visually confirm condition settings in a manner similar to FIG. 2. In the present embodiment as well, the application of extra electron beams to the sample is cut.

(Fourth Embodiment)

Figure 5:
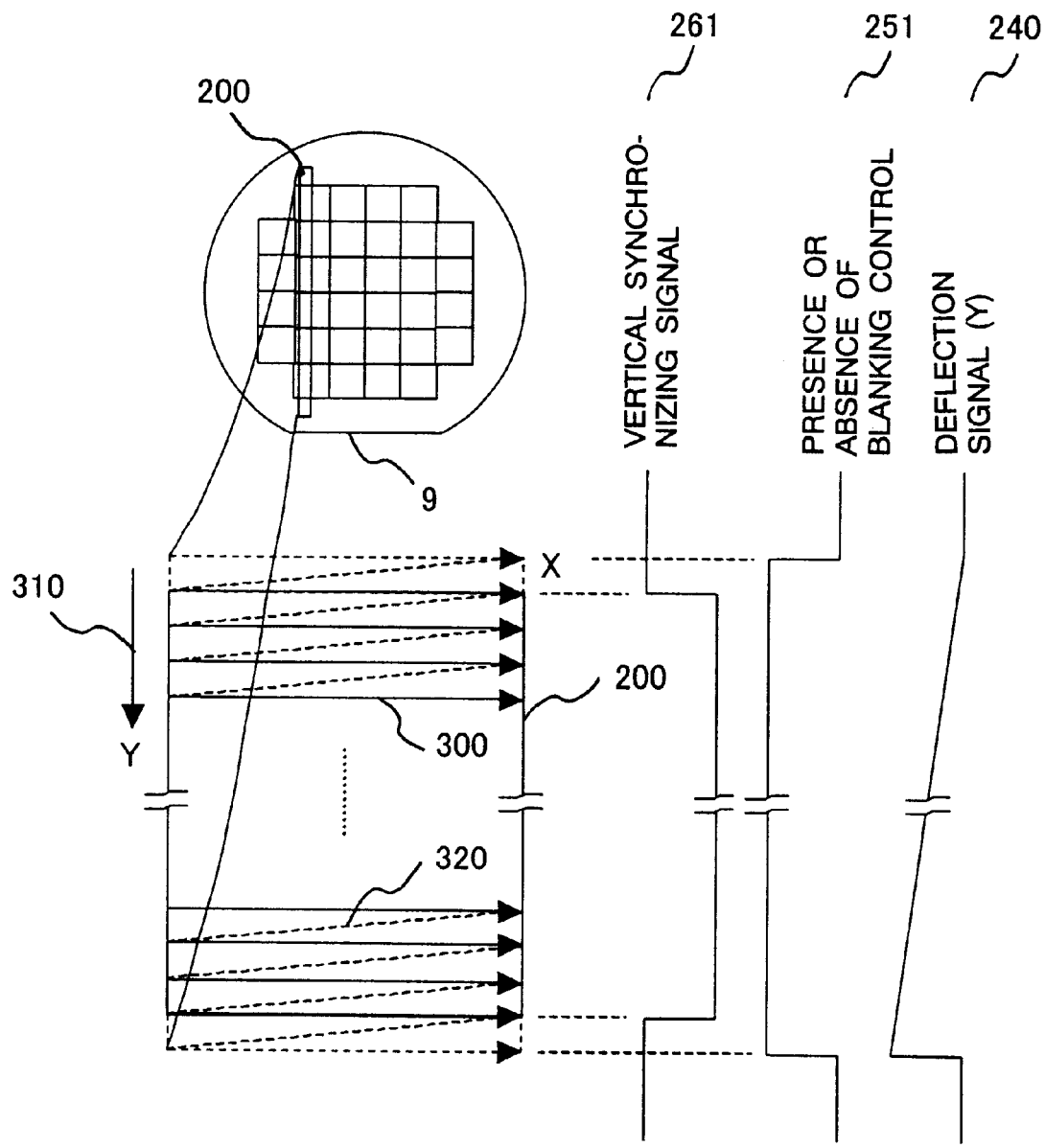
FIG. 5 is a waveform diagram showing sequence timings used in a slow scan according to a fourth embodiment of the present invention.

A fourth embodiment of the present invention is shown in FIG. 5. FIG. 5 is a diagram similar to FIG. 4. FIG. 5 shows a case in which an electron beam is sent in a Y-axis direction under a slow scan while the electron beam is being fast-scanned over a sample 9 in an X-axis direction in the drawing to thereby attempt the inspection of a 1 stripe 200 in the drawing, and illustrates sequence timings for the slow scan in the Y-axis direction thereof. Here, the slow scan in the Y-axis direction may compensate for an electron beam scan according to a stage movement.

The fourth embodiment is different from the third embodiment in that those employed in the third embodiment are respectively replaced by the presence or absence (ON and OFF of a signal 251) of blanking control and the timing used for a vertical synchronizing signal 261. Namely, the present embodiment includes a step for setting the width of the vertical synchronizing signal 261 so as to be narrower than the width of a sawtooth wave portion of a Y-axis deflection signal 240 (Y) and the width (OFF width of signal 251) for the blanking control, i.e., thereby activating the vertical synchronizing signal 261 at a start end (upper end in the drawing) of an electron beam scan area after the stop of the blanking control, and a step for starting blanking after the inactivation of the vertical synchronizing signal 251 at an end (lower end in the drawing) of the electron beam scan area. According to such steps, portions at both ends (upper and lower ends in the drawing) of an area for scanning (deflecting) of the electron beam in the Y-axis direction are removed from an image signal.

In other words, when a desired image acquisition area is set as the width of the horizontal synchronizing signal, this is equivalent to the fact that the electron beam scan area is taken extra greater. Thus, electron-optically unstable portions of a swing start (upper end) and a swing end (lower end) of an electron beam 19 can be removed from the image signal, thereby making it possible to prevent degradation in inspection performance. While FIG. 5 is shown as a diagram in which the width of one scan at a scan start, of electron beam scans and the width of one scan at scan completion, of the electron beam scans are removed from the image signal, those prior to and subsequent to ten scans may preferably be removed in practice.

Meanwhile, the deletion of the horizontally (X-axis)-extending both ends of the images shown in FIGS. 2 and 3 and the deletion of the vertically (Y-axis)-extending both ends of the images described in FIGS. 4 and 5 can be executed by any combinations of the four types. However, FIGS. 2 and 5 may preferably be used in combination. Namely, in regard to the horizontal direction, FIG. 2 indicative of the blanking of the electron beam 19 is preferable to FIG. 3 showing the manner in which the extra electron beams 19 continue to radiate into the sample 9 at all times. In regard to the vertical direction on the other hand, it can be said that the uppermost end and the lowermost end may preferably be cut without fail by means of the vertical synchronizing signal according to the method shown in FIG. 5 in which only extra horizontal scans occur in the uppermost and lowermost ends of the 1 stripe 200 alone.

According to the present invention, there are provided an inspecting system and an inspecting method using an electron beam, both of which are capable of detecting a defect in a sample by use of the electron beam with high accuracy and simultaneously preventing a change in image quality and deflection distortions at the peripheries of both ends of a scan area, which offer or present a problem upon its detection, and degradation in defect inspection performance due to a shading phenomenon or the like.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An inspecting system comprising:
an electron source for generating an electron beam;
lens means for focusing the electron beam;
a sample table for placing a sample thereon;
electron beam scanning means for causing the focused electron beam to scan on the sample;
a detector for detecting secondary charged particles emanated from the sample; and
means for inspecting the surface of the sample, based on an image signal obtained from the detector;
whereby the inspecting means inspects the surface of the sample, based on an image signal in which predetermined both end portions of a scan area for the electron beam are deleted.

2. An inspecting method using an electron beam, including an electron source for generating an electron beam, lens means for focusing the electron beam, a sample table for placing a sample thereon, electron beam scanning means for causing the focused electron beam to scan on the sample, and a detector for detecting secondary charged particles emanated from the sample, whereby the surface of the sample is inspected based on a signal obtained from the detector, said method comprising the steps:
a step for creating an image signal in which predetermined both end portions of an electron beam scan area are deleted; and
a step for inspecting the surface of the sample, based on the image signal.

3. An inspecting system comprising:
an electron source for generating an electron beam;
lens means for focusing the electron beam;
a sample table for placing a sample thereon;
electron beam scanning means for causing the focused electron beam to scan on the sample;
a detector for detecting secondary charged particles emanated from the sample;
means for comparing an image signal based on a signal outputted from the detector with a reference signal; and
a monitoring device for displaying the image signal thereon,
wherein the monitoring device is provided with means for distinctively displaying, within a scan area of the electron beam scanning means, areas each having a predetermined width at its scan start end and scan completion end, and image areas lying therein.

4. An inspecting system comprising:
an electron source for generating an electron beam;
lens means for focusing the electron beam;
a sample table for placing a sample thereon;
electron beam scanning means for causing the focused electron beam to scan on the sample in a relationship of coexistence between a fast scan on the sample in a first direction and a slow scan on the sample in a second direction substantially orthogonal to the first direction;
a detector for detecting secondary charged particles emanated from the sample;
means for comparing an image signal based on a signal outputted from the detector with a reference signal;
a monitoring device for displaying the image signal thereon; and
means for setting end areas lying within an area for the slow scan in the slow scanning direction and unused in the image comparing means.

5. The inspecting system according to claim 4, further including means for blanking the electron beam, and wherein the blanking means is set so as to operate in the end areas lying in the slow scanning direction.

6. The inspecting system according to claim 4, further including vertical synchronizing signal generating means for forming a desired image signal from the signal outputted from the detector, based on the slow scan, and wherein the vertical synchronizing signal generating means is set so as to extract an image signal from a scan area excluding the end areas lying in the slow scan direction.

7. An inspecting method using an electron beam, comprising the steps:

a step for applying the electron beam to a sample to scan;

a step for blanking the application of the electron beam to the sample;

a step for detecting secondary charged particles emanated from the sample;

a step for generating a horizontal or vertical synchronizing signal for determining a period to detect the secondary charged particles;

a step for inspecting the sample, based on the detected signal;

a step for stopping the blanking at a start end of a scan area for the electron beam after the startup of the horizontal or vertical synchronizing signal; and a step for inactivating the horizontal or vertical synchronizing signal at an end of the scan area for the electron beam after the start of the blanking.

8. An inspecting method using an electron beam, comprising the steps:

a step for applying the electron beam to a sample to scan;

a step for blanking the application of the electron beam to the sample;

a step for detecting secondary charged particles emanated from the sample;

a step for generating a horizontal or vertical synchronizing signal for determining a period to detect the secondary charged particles;

a step for inspecting the sample, based on the detected signal;

a step for activating the horizontal or vertical synchronizing signal at a start end of a scan area for the electron beam after the stop of the blanking; and a step for starting the blanking at an end of the scan area for the electron beam after the inactivation of the horizontal or vertical synchronizing signal.

9. An inspecting method using an electron beam, comprising the steps:

a step for applying the electron beam to a sample to scan;

a step for detecting secondary charged particles emanated from the sample;

a step for generating a horizontal or vertical synchronizing signal for determining a period to detect the secondary charged particles;

a step for inspecting the sample, based on the detected signal;

a step for activating the horizontal or vertical synchronizing signal after the start of scanning of the electron beam; and a step for inactivating the horizontal or vertical synchronizing signal before the stop of scanning of the electron beam.

10. An inspecting method using an electron beam, comprising the steps:

a step for applying the electron beam to a sample to scan in a horizontal or vertical direction;

a step for blanking the application of the electron beam to the sample;

a step for detecting secondary charged particles emanated from the sample;

a step for generating a horizontal or vertical synchronizing signal for determining a period to detect the charged particle;

a step for inspecting the sample, based on the detected signal;

a step for stopping the blanking at a start end of a horizontal scan area after the activation of the horizontal synchronizing signal;

a step for inactivating the horizontal synchronizing signal at an end of the horizontal scan area after the start of the blanking;

a step for activating the vertical synchronizing signal at a start end of a vertical scan area after the stop of the blanking; and a step for starting the blanking at an end of the vertical scan area after the inactivation of the vertical synchronizing signal.

* * * * *